United States Patent [19]
Cronin et al.

[11] Patent Number: 5,654,238
[45] Date of Patent: Aug. 5, 1997

[54] METHOD FOR ETCHING VERTICAL CONTACT HOLES WITHOUT SUBSTRATE DAMAGE CAUSED BY DIRECTIONAL ETCHING

[75] Inventors: John Edward Cronin, Franklin County; Michael David Potter, Grand Isle County; Gorden Seth Starkey, Chittenden County, all of Vt.

[73] Assignee: International Business Machines Corporation, Armonk, N.Y.

[21] Appl. No.: 510,718

[22] Filed: Aug. 3, 1995

[51] Int. Cl.$^6$ ................................................ H01L 21/44
[52] U.S. Cl. ...................... 438/700; 438/637; 438/704; 438/696
[58] Field of Search ................. 437/195, 228 SW, 437/926; 148/DIG. 51

[56] References Cited

U.S. PATENT DOCUMENTS

| | | |
|---|---|---|
| 4,636,281 | 1/1987 | Buiguez et al. . |
| 4,707,218 | 11/1987 | Giammarco et al. . |
| 4,792,534 | 12/1988 | Tsuji et al. ............ 437/228 SW |
| 4,857,477 | 8/1989 | Kanamori . |
| 4,878,105 | 10/1989 | Hirakawa et al. . |
| 5,279,989 | 1/1994 | Kim ............................ 437/195 |
| 5,567,270 | 10/1996 | Liu ............................. 437/195 |

FOREIGN PATENT DOCUMENTS 086977  4/1987  Japan .

OTHER PUBLICATIONS

Kerbaugh, et al., "Methods of Forming Small Contact Holes", IBM Technical Disclosure Bulletin V30, N8, dtd Jan. 1988, pp. 252–253.

Davis, "Fabrication of a Sub–Minimum Lithography Trench", IBM Technical Disclosure Bulletin V29, N6, dtd Nov. 1986, pp. 2760–2761.

Pogge, "Narrow Line–Width Masking Method", IBM Technical Disclosure Bulletin V19, N6, dtd Nov. 1976, pp. 2057–2058.

Primary Examiner—Trung Dang
Attorney, Agent, or Firm—Whitham, Curtis, Whitham & McGinn; Howard J. Walter, Jr.

[57] ABSTRACT

A method of etching vias without directional etching damage to the substrate. A pattern image is formed on an insulating layer of known thickness over a substrate. A conformal layer is formed on the pattern image. A vertical contact hole through the conformal layer and into the insulating layer is produced by directional etching. The directional etch also leaves conformal sidewall spacers of a defined width. The depth of the vertical contact hole is equal to the thickness of the insulating layer minus the width of the conformal spacer. The insulating layer is then removed by an isotropic wet etch to achieve a near vertical edge contact hole without directional etching damage to the substrate. The sidewall spacers may also be removed by etching prior to removal of the insulating layer.

8 Claims, 1 Drawing Sheet

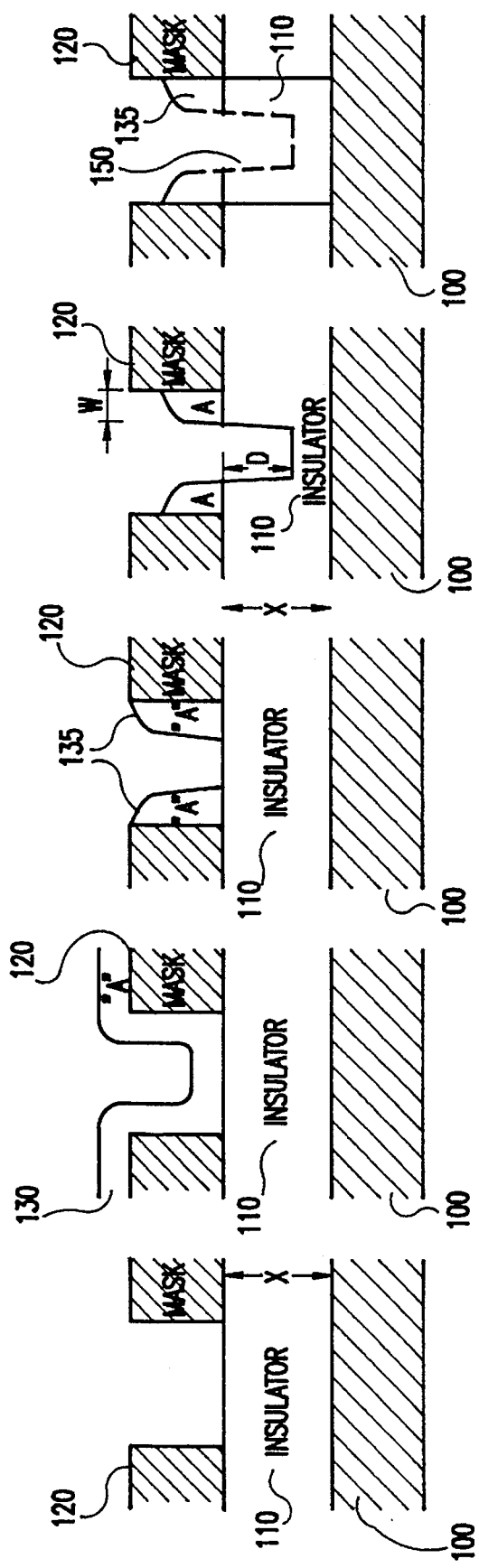

METHOD FOR ETCHING VERTICAL CONTACT HOLES WITHOUT SUBSTRATE DAMAGE CAUSED BY DIRECTIONAL ETCHING

BACKGROUND OF THE INVENTION

1. Field of the Invention

The present invention generally relates to a method of making vertical contact holes through an insulator to a silicon substrate, and, more particularly, to a method of etching vertical contact holes without substrate damage caused by directional etching.

2. Description of the Related Art

In the semiconductor industry, there is a need to create vertical contact holes through an insulator to the silicon or other semiconductor substrate to minimize image size. A typical technique employs an appropriate mask positioned over an insulator to define the contact holes. This is followed by a directional etch, such as an anisotropic reactive ion etch (RIE) that etches the underlying insulator to form the vertical contact holes.

However, vertical contact processing using a directional or reactive ion etch (RIE) generally damages (etches) the underlying silicon substrate as well, since the RIE etch is not selective enough to stop on the silicon substrate. The damage—caused by chemical and/or ion bombardment attack—limits precise definition of shallow emitters, especially for bipolar technologies.

Wet etching of contact holes through the insulator is extremely selective and does not damage the silicon substrate. The wet etch, however, results in contact holes having curved edges through the insulator to the substrate, which undesirably increases the contact hole size.

In an effort to overcome such difficulties, shallow emitter technologists and designers have employed an etch stop in the vertical RIE contact process, followed by a subsequent isotropic wet etch of the etch stop. While the wet etch leaves the silicon surface undamaged, it also undercuts the etch stop in the vertical contact hole since the isotropic wet etch etches equally in all directions. This causes a problem for subsequent metal coverage and/or proper contact only to the emitter.

In light of the foregoing, there exists a need for a method of creating vertical contact holes or vias without directional etching damage to the underlying substrate and without the undercutting problem associated with isotropic wet etches.

SUMMARY OF THE INVENTION

The present invention is directed to method of maintaining a near vertical edge in a contact hole, without directional etching damage to the silicon substrate, which substantially obviates one or more of the problems due to the limitations and disadvantages of the related art.

In addition, the present invention eliminates the etch stop contact undercut normally associated with wet etch methods.

To achieve these and other advantages and in accordance with the purpose of the invention, as embodied and broadly described, the invention provides for a method of etching vertical contact holes in a semiconductor device having an insulating layer of known thickness 'X' formed over a substrate, the method comprising the steps of: (1) forming a pattern image on the insulating layer; (2) forming a conformal layer on the pattern image; (3) etching the conformal layer by directional etching to produce sidewall spacers, each of width 'W' and having a vertical contact hole therebetween, the etching continuing to the insulating layer to a depth equal to the thickness 'X' of the insulating layer minus the width 'W' of the sidewall spacer; and (4) isotropically removing the insulating layer to achieve a near vertical edge contact hole without directional etching damage to the substrate.

In another aspect, the method of the present invention may comprise the additional step of removing the sidewall spacers prior to removing the insulating layer.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a side cross sectional view of a semiconductor device showing a mask defined on an insulator;

FIG. 2 is a side cross sectional view of the device of FIG. 1 after deposition of a conformal coating;

FIG. 3 is a side cross sectional view of the device of FIG. 2 after a PIE etch of the conformal coating;

FIG. 4 is a side cross sectional view of the device of FIG. 3 following a PIE etch of a portion of the insulator; and FIG. 5 is a side cross sectional view of the device of FIG. 4 following a isotropic wet etch of the insulator and after removal of the conformal spacer material.

DETAILED DESCRIPTION OF A PREFERRED EMBODIMENT OF THE INVENTION

Forming vertical contact holes or vias is an integral part of the semiconductor manufacturing process. Accordingly, it would be understood by those or ordinary skill in the art that the method of the present invention may be used in a wide variety of integrated circuit applications. Moreover, the inventive method disclosed below may be practiced at any point in the semiconductor manufacturing process.

Referring now to the drawings, and more particularly to FIG. 1, there is shown an insulator layer 110 formed over a silicon substrate wafer 100. By way of example, and not by limitation, the insulating layer 110 may be comprised of silicon glasses such as silicon dioxide ($SiO_2$) or silicon nitride ($Si_3N_4$), or other suitable oxide materials such as aluminum trioxide ($Al_2O_3$). $SiO_2$ may be grown by any conventional means, including for example, either a wet or dry oxygen ambient at temperatures between 800° C.–1200° C.

Likewise, $Si_3N_4$ may be formed by any conventional means, including for example, chemical vapor deposition (CVD). There is a wide variance in the processing conditions for CVD. A typical reaction is the combination of silane ($SiH_4$) and ammonia ($NH_3$) in an inert atmosphere, usually nitrogen ($N_2$), argon (Ar), or hydrogen ($H_2$), at a typical temperature range of 750° C.–850° C. Conventional low-pressure (LPCVD) or plasma enhanced (PECVD) techniques may also be utilized.

In general, the insulating layer could be composed of any material, so long as an image could be patterned thereon for subsequent etching. The appropriate thickness 'X' of the insulating layer would depend on the material chosen, and the desired depth of the trench. A suitable mask 120, composed of resist or other suitable material, is positioned over the insulator 110 to define the contact or via holes where required.

In FIG. 2, a conformal layer of material 130 is deposited over the mask. The conformal layer should have similar etch characteristics to that of the insulator material 110. Examples of suitable conformal materials include, but are not limited to, insulators, paralyne, $SiO_2$, $Si_3N_4$, or $Al_2O_3$.

As shown in FIG. 3, the conformal layer 130 is then directionally etched, using a reactive ion etch (RIE) for example, to form sidewall spacers 135. It is understood that other conventional directional etching techniques, such as planar plasma (or diode) etching for example, may be utilized in the practice of this invention.

In FIG. 4, the directional or RIE etch continues through to the insulating layer 110 to a depth 'D' equal to the thickness 'X' of the insulating material 110 minus the width 'W' of the spacer 135, that is, D=X-W.

In FIG. 5 the dashed lines illustrate that a portion of the insulating layer 110 and/or the conformal layer 130 (defined by remaining spacers 135) may be removed. The conformal layer may be, but need not be removed prior to removing the insulating layer.

If the particular semiconductor device application required removal of the conformal layer, composed of paralyne for example, the sidewall spacers 135 may be removed by an isotropic $O_2$ plasma etch. The insulating layer 110 is then removed by an appropriate isotropic wet etch, such as buffered hydrogen fluoride (BHF) for etching silicon dioxide. Note that the wet etch—which etches equally in all direction—does not undercut the image under the mask 120. This is because the thickness or width of the insulating material 110 that is etched is equal to the width of the spacer material 135.

In the final step, the mask 120 may be removed by conventional means. What remains is a contact or via hole 150 with a near vertical edge without directional etching or RIE damage to the underlying substrate and without the undercutting problem associated with isotropic wet etches.

While the invention has been described in terms of the embodiments described above, those skilled in the art will recognize that the invention can be practiced with modification within the spirit and scope of the appended claims.

Having thus described my invention, what we claim as new and desire to secure by Letters Patent is as follows:

1. A method of etching vertical contact holes in a semiconductor device having an insulating layer of known thickness 'X' formed over a substrate, the method comprising the steps of:

forming a pattern image on the insulating layer;

forming a conformal layer on the pattern image;

etching said conformal layer by directional etching to produce sidewall spacers, each of width 'W' and having a vertical contact hole therebetween, said etching continuing to the insulating layer to a depth equal to the thickness 'X' of the insulating layer minus the width 'W' of the sidewall spacer; and isotropically removing the insulating layer to achieve a near vertical edge contact hole without directional etching damage to the substrate.

2. A method as in claim 1, further comprising the step of removing the sidewall spacers by etching prior to removing the insulating layer.

3. A method as in claim 1, wherein the insulating layer is selected from the group consisting of silicon dioxide, silicon nitride, and oxides.

4. A method as in claim 3, wherein the oxide is aluminum trioxide.

5. A method as in claim 1, wherein the conformal layer is selected from the group consisting of insulators, paralyne, silicon dioxide, silicon nitride, and aluminum trioxide.

6. A method as in claim 1, wherein the isotropically removing step utilizes a buffered hydrogen fluoride (BHF) solution to isotropically etch a silicon dioxide insulting layer.

7. A method as in claim 2, wherein the sidewall spacer removing step utilizes an oxygen plasma to etch a paralyne conformal layer.

8. A method as in claim 1, wherein the directional etch is reactive ion etch (RIE).

* * * * *